United States Patent [19]
Vigil et al.

[11] Patent Number: 5,732,209
[45] Date of Patent: Mar. 24, 1998

[54] SELF-TESTING MULTI-PROCESSOR DIE WITH INTERNAL COMPARE POINTS

[75] Inventors: Peter J. Vigil, San Jose; Louis S. Lederer, Sunnyvale; James S. Blomgren, San Jose, all of Calif.

[73] Assignee: Exponential Technology, Inc., San Jose, Calif.

[21] Appl. No.: 649,117

[22] Filed: May 14, 1996

Related U.S. Application Data

[63] Continuation-in-part of Ser. No. 564,721, Nov. 29, 1995.

[51] Int. Cl.$^6$ .................................................. G06F 11/26
[52] U.S. Cl. ............................................... 395/183.06
[58] Field of Search ................... 364/488, 490, 364/228.3; 395/183.06, 182.09; 326/9, 10; 371/22.31, 22.34, 49.1

[56] References Cited

U.S. PATENT DOCUMENTS

| | | | |
|---|---|---|---|
| 4,191,996 | 3/1980 | Chesley | 364/200 |
| 4,233,682 | 11/1980 | Liebergot et al. | 371/68 |
| 4,412,282 | 10/1983 | Holden | 364/200 |
| 4,633,039 | 12/1986 | Holden | 379/32 |
| 4,658,354 | 4/1987 | Nukiyama | 364/200 |
| 4,785,395 | 11/1988 | Keeley | 364/200 |
| 4,907,228 | 3/1990 | Bruckert et al. | 371/68.3 |
| 5,164,943 | 11/1992 | Waggoner | 371/3 |
| 5,168,499 | 12/1992 | Peterson et al. | 371/11.3 |
| 5,193,175 | 3/1993 | Cutts, Jr. et al. | 395/575 |
| 5,202,978 | 4/1993 | Nozuyama | 395/575 |
| 5,222,068 | 6/1993 | Burchard | 371/22.3 |
| 5,226,149 | 7/1993 | Yoshida et al. | 395/575 |
| 5,249,188 | 9/1993 | McDonald | 371/68.3 |
| 5,253,255 | 10/1993 | Carbine | 371/22.6 |
| 5,416,783 | 5/1995 | Broseghini et al. | 371/22.3 |
| 5,435,001 | 7/1995 | Rahman et al. | 395/575 |
| 5,440,724 | 8/1995 | Boothroyd et al. | 371/22.5 |
| 5,479,647 | 12/1995 | Harness et al. | 395/550 |
| 5,617,531 | 4/1997 | Crouch et al. | 395/183.06 |
| 5,640,508 | 6/1997 | Fujiwara et al. | 395/183.06 |

OTHER PUBLICATIONS

"Logic Design Principles with Emphasis on Testable Semicustom Circuits", E. McCluskey, 1986, pp. 433–480.

*Primary Examiner*—Hoa T. Nguyen
*Assistant Examiner*—Stephen C. Elmore
*Attorney, Agent, or Firm*—Stuart T. Auvinen

[57] ABSTRACT

A microprocessor die contains several CPU cores that are substantially identical. A large second-level cache on the die is shared among the multiple CPU's. When 3 CPU's are on the die, their outputs are compared during a self-testing mode. If outputs from all three CPU's match, then no error is detected. When two CPU's outputs match, but a third CPU's output mismatches, then the third CPU is faulty. The output compared from each CPU is a serial scan-chain shift-out, parity from internal test points, and a result written to the shared cache. Each CPU core has a serial scan chain. The serial scan chain strings together most flip-flops in the CPU core into a serial chain. A test clock is pulsed to shift out the data from these flip-flops. During each test clock period, the serial data from each CPU is compared to the serial data from other CPU's. Internal test points within each CPU core are defined at high traffic areas in the pipeline. Parity is generated from these internal test points, and the parity from one CPU is compared to that for other CPU's during each CPU clock cycle. The results from each CPU core written back to the shared cache are also compared, and arbitration allows one CPU to write the result to the shared cache while results from other CPU's are discarded. A self-test circuit on the die accumulates errors for each CPU and reports these errors to an inexpensive external tester.

19 Claims, 8 Drawing Sheets

SELF-TESTING MULTI-PROCESSOR DIE WITH INTERNAL COMPARE POINTS

RELATED APPLICATIONS

This application is a continuation-in-part (CIP) of "Microprocessor with a Large Cache Shared by Redundant CPU's for Increasing Manufacturing Yield", U.S. Ser. No. 08/564,721, filed Nov. 29, 1995, having a common inventor and assigned to the same assignee.

FIELD OF THE INVENTION

This invention relates to testing of complex integrated circuits (IC's), and more particularly for methods to test microprocessors having multiple CPU cores.

DESCRIPTION OF THE RELATED ART

As integrated circuits (IC's) have become more complex, the cost to test the IC has increased dramatically. Microprocessors in particular have extremely high test costs. For example, a microprocessor die on a silicon wafer may cost $100 to manufacture. Good die are sorted out from bad die by an initial test of each die on the wafer, known as a wafer-sort test. The wafer is then sawed into individual die and the good die are packaged. The packaged die are then tested once again and undergo a temperature-stress test known as burn-in. After burn-in the packaged die are tested once more to screen out marginal parts. Thus each good die is tested at least three times.

Since a defect could occur on any of the million or more transistors on a microprocessor, many test vectors must be applied to fully test the microprocessor. Equipment to test integrated circuits is expensive and thus longer test sequences are more expensive. A typical test cost might be $8.00. The three tests, wafer-sort, after packaging, and after burn-in, add $24 to the $100 manufacturing cost. The total cost, including packaging and miscellaneous costs, is about $170. Although this is just an example, test costs represent a significant portion of the total costs.

As microprocessors increase in complexity, test costs increase at an expanding rate. Embedded state machines and other sequential logic are often nearly impossible to test unless special test circuitry is added to control and observe electrical nodes deep within the processor. Often all flip-flops within the processor are chained together into a "scan chain" to allow their states to be read or controlled at any time-point when the processor's normal clock is stopped. Other scan chains may be added to the I/O pins, or around sub-blocks within the processor die.

Rather than use external test vectors from a tester, the processor may include self-test logic to generate the test vectors within the die. Broseghini et al., U.S. Pat. No. 5,416,783 assigned to Motorola, generates pseudo-random numbers using the central processing unit (CPU) itself, and then compares the results from scan chains and generates a signature. Special test micro-instructions are used by Nozuyama, U.S. Pat. No. 5,202,978, assigned to Toshiba.

Applicant's parent application cited above describes a microprocessor die which has two or more CPU cores (possibly with local caches) which share a large cache. Manufacturing yield, even of single-CPU die, is increased relative to die with just one CPU core since the shared cache is more likely to be used by one of the CPU cores, even when the other CPU core is defective.

Testing two CPU's on a single die can easily double the test vectors required. Test logic on the die can connect a first CPU core to I/O pins while a full CPU test is run on the first CPU core. Then the test logic can connect the second CPU core to the I/O pins and the full CPU test run on the second CPU core. Although the full CPU test can be nearly identical for the two CPU cores, the amount of time on the tester nearly doubles, as does the test cost.

For board-level systems, one CPU has been used to check the output from the other CPU. This is sometimes known as a master/checker scheme. The two CPUs can be operated in exact lock-step or more loosely. McDonald, U.S. Pat. No. 5,249,188, assigned to AG Communications Systems Corp., describes a master/checker where READY signals are used for synchronization.

What is desired is test circuitry and methods to test integrated circuits which have multiple CPU cores on a single die. It is desired to reduce the cost of testing die having multiple CPU cores. It is also desired to combine existing scan-chain techniques with multi-processor test techniques.

SUMMARY OF THE INVENTION

A self-testing microprocessor die has a first central processing unit (CPU) core and a second CPU core and a third CPU core, all substantially identical in function to the first CPU core. The first, second, and third CPU cores each have a pipeline for processing a plurality of general-purpose instructions.

A shared cache is coupled to supply instructions and operands to the first CPU core, the second CPU core, and the third CPU core. The shared cache is further coupled to I/O pins on the self-testing microprocessor die. A self-test controller receives a first output from the first CPU core, a second output from the second CPU core, and a third output from the third CPU core. It compares the first output, the second output, and the third output. An error signal means is coupled to the self-test controller. It signals a first error in the first CPU core when the first output does not match the second and third outputs; it signals a second error in the second CPU core when the second output does not match the first and third outputs, and it signals a third error in the third CPU core when the third output does not match the first and second outputs.

Error output means is coupled to the error signal means. It applies to the I/O pins of the self-testing microprocessor die signals which indicate the first, second, and third errors. The first, second, and third outputs are not applied to the I/O pins of the self-testing microprocessor die, and an external tester does not receive or compare the first, second, and third outputs from each CPU core. The external tester merely reads the first, second, and third errors from the error signal means. Thus outputs from different CPU cores are compared on-chip for signaling an error.

In further aspects the first, second, and third outputs each are result data generated by processing of a general-purpose instruction in the pipeline. The result data is written to the shared cache. Thus results written back to the shared cache from different CPU cores are compared for self-test.

In other aspects the first, second, and third outputs each are a shift-out output. Each CPU core also has a scan chain of flip-flops within each CPU core. The scan chain serially shifts data in the flip-flops out to the shift-out output. Thus scan chains from different CPU cores are compared for self-test.

In another aspect the first, second, and third outputs each are a plurality of internal test points within each CPU core. The internal test points are inaccessible from the I/O pins of the self-testing microprocessor die. Thus internal test points from different CPU cores are compared for self-test. The internal test points are compressed before being transmitted to the self-test controller.

DETAILED DESCRIPTION

Figure 1:
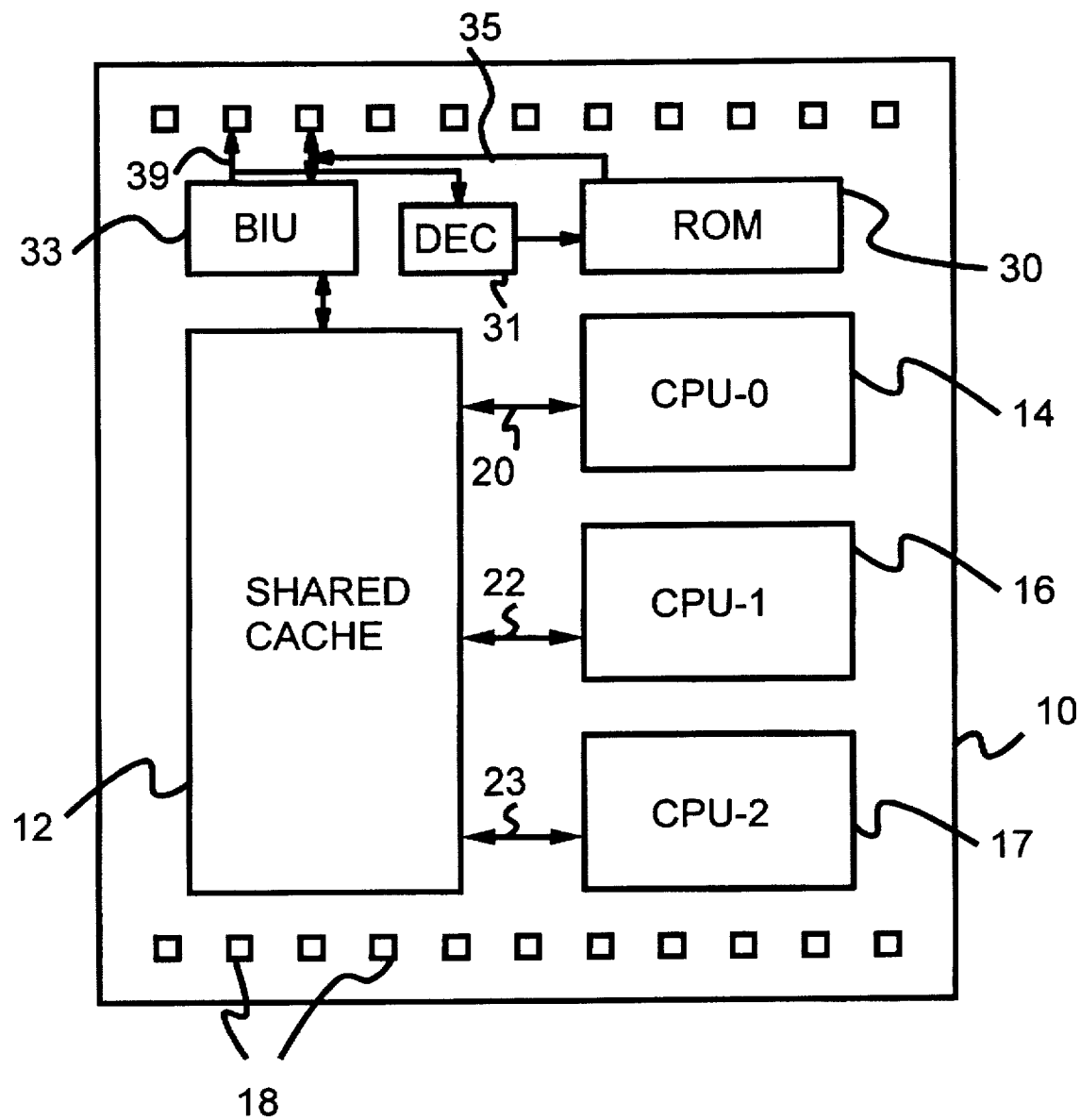
FIG. 1 shows a multi-processor die with a large shared cache and a read-only memory (ROM) containing test routines which is shared among the CPU cores.

The present invention relates to an improvement in testing microprocessors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

OVERVIEW AND ADVANTAGES

The inventors have realized that the cost to test a complex microprocessor is a significant portion of the total manufacturing cost. As complexity increases, test cost can increase significantly while the basic silicon die costs otherwise decrease. Thus the problem of test cost must be addressed.

Having more than one central processing unit (CPU) core on a microprocessor die could increase test cost significantly if the additional CPU cores are tested in the standard serial fashion. The inventors have realized that multiple CPU cores provide a means of testing other CPU cores in a parallel fashion. Parallel testing can significantly decrease test costs. One CPU core can act as the source of comparison test vectors for the other CPU cores.

Self-Test Using Multiple CPU Cores Avoids External Compare

The inventors have pondered various existing test techniques and have found synergy when these techniques are combined with parallel testing of the multiple CPU cores. For example, the outputs from each CPU core can be compared to determine when all cores generate identical outputs when executing identical test programs in lock-step. Since it is so unlikely that all cores could generate the same outputs and yet be faulty, it can safely be assumed that matching outputs indicate that the good, expected result was generated, without using an external tester to compare the outputs from each core to the expected value.

Using one CPU core to self-test other cores has a speed advantage over using the external tester to compare results to expected values. External I/O is slower than internal compares, so a higher clock rate is used for self-test than for external test. The higher clock rate reduces the time spent on the tester, lowering test cost. The external test program is simpler, since it merely has to let the internal self-test run and wait for a mis-match to be signaled from the internal compares, rather than compare each clock cycle's outputs from each CPU core.

Because the self-test generates the test sequence internally, few external test vectors are required. The external tester can use a smaller memory for test vectors, and less-expensive external testers may be used, further reducing test cost. Tester time is further reduced because new test vectors do not have to be loaded into the external tester's memory as often.

The routing within the die is also simplified, since the outputs from each core do not have to be muxed to I/O pins for compare by the external tester. Fewer I/O pins are needed for test purposes, which reduces the number of shared pins which may be slower due to the increased loading of the test muxes.

Self-Test Using Serial Scan Chains

The output of each CPU core which is compared may be the data written by the processor's pipeline. However, the output compared may also be a serial bit shifted out of a serial scan chain used to test the flip-flops within the processor core. The execution of the processors may be halted so that the values of all flip-flops in the serial chain may be shifted out to test the internal state of the processors. These serial-shift techniques, known by various terms such as level-sensitive scan design (LSSD). See *Logic Design Principles with Emphasis on Testable Semicustom Circuits*, by E. J. McCluskey, Prentice-Hall, 1986, pages 433–474, which also includes a discussion of built-in-self-test (BIST) techniques.

Scan Chains Not Shifted Out to External Tester

While previous scan techniques shifted the contents of the scan chain off the die to be compared by the external tester, the inventors have realized that each core's scan output can simply be compared to the scan output from other cores. The scan-chain's contents need not be shifted off the die to the external tester. The scan chain's shift-out of one CPU core is compared to the scan chain's shift-out of another CPU core, with a mis-match indicating an error. Since long scan chains require many clock cycles to shift out, serial-bit compares are performed each clock cycle until the entire chain has been shifted out. Once each serial bit has successfully compared, it can be discarded. The serial scan chain's clock can be operated at a higher rate when using internal compare than when being shifted off-chip for compare by the external tester.

The compare logic for the serial scan-chain compare is relatively simple. When only one serial bit is shifted out of each CPU, only a one-bit-wide comparator is needed. A set-reset (S-R) latch can be used to accumulate errors and indicate to the external tester after the scan chain has been completely shifted out that an error occurred somewhere during the serial-chain test.

The core's "output" which is compared may also include internal test points within the core itself. Internal test points are implemented which are separate from the scan chains. These internal test points can be defined and compared to the same test points in other cores each cycle of the normal CPU clock. A large number of bits may be compared since external I/O pins are not needed. These internal test points can be compressed by a parity or CRC scheme before being sent for comparison to other cores or to a central location on the die.

The 'test program' which is executed by the CPU cores is simply a series of CPU instructions which are loaded into the cache shared by the CPU's. Loading this test program from an external tester requires a number of tester cycles to transfer the test program to the shared cache. An on-chip read-only memory (ROM) can be used to permanently store the test program so that the test program does not have to be transferred from the external tester. The ROM can shadow the shared cache, supplying the instructions on demand to the CPU cores rather than the shared cache. The ROM can also copy the test program to the shared cache before execution of the test program.

The on-chip ROM containing the self-test program can reduce the number of test vectors and test cycles of the external tester, thus reducing tester time and cost. The ROM reduces the number of external test vectors input to the die, while the internal comparisons reduces the need for the external tester to perform external comparisons. This combination greatly reduces the tester time required, and allows slower, less expensive external testers to be used.

Self-test can be used to quickly test a large portion of die 10 of FIG. 1 to quickly screen out bad die and move on to the next die. Test cost is reduced when common failures are screened for early in the test sequence, and often the test sequence is adjusted as it becomes more clear what the common failures are. While the self-test may not completely test the die, it may be sufficient to reach a high effective yield of die passing the self-test. At the high effective yield it may be cost-effective to package all die that pass the self test at wafer sort, and simply throw away those packaged die which pass the self-test but do not pass the more exhaustive final tests.

The number of scan-test vectors can be reduced by performing the self-test first, and then deleting scan-test sequences that merely re-test logic that self-test has already determined to be functional. Since self-test is much more efficient than scan-chain tests, overall test cost can be reduced. Perhaps the more comprehensive scan tests can be reduced by 30% to 50% when preceded by self-test.

MULTI-CPU DIE WITH SELF-TEST PROGRAM IN ROM

FIG. 1 shows a multi-processor die with a large shared cache and a read-only memory (ROM) containing test routines which is shared among the CPU cores.

Die 10 includes a first CPU core 14 and a second CPU core 16 and a third CPU core 17. These CPU cores are substantially identical in function and possibly in layout. A large cache memory 12 serves as a cache to either the first, second, or third CPU core 14, 16, 17 or all. Data stored in cache memory 12 is accessible by CPU cores 14, 16, 17 over busses 20, 22, 23 respectively. Cache memory 12 is simply provided with one or more additional ports to allow communication with second CPU core 16 and third CPU core 17. Cache memory 12 typically includes an additional port to an external bus through pads or I/O pins 18 for an external requester, to allow for cache line invalidations and snooping.

Cache memory 12 is a second-level cache when CPU cores 14, 16, 17 contain within them one or more primary caches. The first-level primary caches are preferably within the CPU cores 14, 16, 17 so that these primary caches can quickly supply instructions and operands to the execution pipelines within CPU cores 14, 16, 17. If cache memory 12 were the primary cache, then sharing cache memory 12 between two or more CPU cores increases the loading and length of interconnect busses 20, 22 to the CPU cores 14, 16, 17, increasing delays and slowing down the speed of the processor. Since the primary caches have a moderately high hit rate, most requests from the pipelines within CPU cores 14, 16, 17 are handled by the primary caches within these cores. Thus the relatively few primary cache misses do not significantly reduce performance if busses 20, 22 to cache memory 12 become longer and slower because the second and third CPU cores 16, 17 are added to the die.

Cache memory 12 is shared by CPU cores 14, 16, 17. When only one CPU core is functional, then the entire storage area of cache memory 12 is available for that one functional CPU core. When all CPU cores 14, 16, 17 are functional, then cache memory 12 may be shared between the CPU cores, either by some partitioning of cache memory 12, or by allowing either CPU core to access any location in cache memory 12 and allowing cache lines to be allocated as needed. When cache memory 12 is a set-associative cache, some of the sets on replacement can have an affinity to one CPU core while other sets can have an affinity toward the other CPU core, although when all sets for one CPU core are used, the other CPU core's sets can then be allocated to the first CPU core.

Cache memory 12 may itself be a composite memory structure, including translation-lookaside buffers (TLB's), and other storage areas besides just instructions and data. Bus-interface unit (BIU) 33 connects to cache memory 12 so that BIU 33 is effectively shared between the CPU cores as well. Thus a single BIU 33 to the external I/O pins 18 is also shared between the 3 CPU cores. BIU 33 sends out an address over address bus 39 and data over data bus 35 to external I/O pins 18. Many pins are required for connecting busses 35, 39 to external components.

Die 10 is packaged as a triple-processor chip when CPU cores 14, 16, 17 and cache memory 12 are all functional. When only one of the CPU cores 14, 16, 17 and cache memory 12 are functional, then die 10 is packaged as a uni-processor by using a bonding option to bonding pads or I/O pins 18. When only two of the CPU core are functional, the bonding option disables the defective CPU core using many possible approaches. The bonding option can activate power-supply logic to disconnect the power supply to the defective CPU core, or the bonding option can disconnect cache memory 12 from the defective CPU core by blocking requests from that defective CPU core, or by disconnecting its interconnect bus. The bonding option may also disable a defective CPU core by preventing state machines in its control logic from leaving the reset state. However, since it is desired to reduce power as much as possible, powering-down the defective CPU core is the preferred method. The bonding option can be as simple as an option pin that is bonded to ground to disable a CPU core, with the ground voltage being sensed and used to permanently power-down the defective CPU core. A fusible element can also be used in place of the bonding option.

ROM 30 contains test programs and test vectors for testing the CPU cores 14, 16, 17. ROM 30 transmits these test vectors over data bus 35 to BIU 33 when ROM decoder 31 detects that the external address on address bus 39 is an external address for data in ROM 30. Thus ROM 30 can appear to be an external component even though it is located on die 10. The test vectors can appear as instructions which are executed on the CPU cores. Additionally, when BIU 33 has additional ROM handshaking logic, ROM 30 may contain compare routines to compare a data operand written out to external memory from cache 12 and CPU cores 14, 16, 17. When the data operand does not match from different CPU cores, an error is detected and the CPU core that wrote the data operand is marked as defective.

Since ROM 30 is shared among the CPU cores, the cost for including ROM 30 on the 3-P die is shared among the CPU cores. ROM 30 is a much higher density array structure than cache 12 so that the additional die area for ROM 30 is minimal. ROM 30 may also include test sequencing logic to initiate and control the test routines which can operate at the full clock rate of the CPU cores. Thus the testing of the CPU cores is accelerated compared to an external tester supplying test vectors over I/O pins 18. This reduces test cost.

ROM 30 may also contain test routines and vectors for testing cache memory 12. Test patterns such as checkerboard, walking ones and zeros can easily be generated by a simple test routine. ROM 30 along with BIU 33 performs an error check or CRC of itself by running a check routine on its data.

Cache memory 12 is large in comparison to the sizes of CPU cores 14, 16, 17, perhaps being twice the size of a single CPU core. Row or column redundancy within cache memory 12 can make it much more likely that cache memory 12 is functional, even though it has a larger size. As process technology continues to improve, especially with dense multi-layer-metal routing, CPU cores 14, 16, 17 may continue to shrink while larger-capacity cache memories are employed, making the relative size of each CPU core decrease and making the invention more effective.

TEST ROUTINE FOR CPU CORES—FIG. 2

Figure 2:
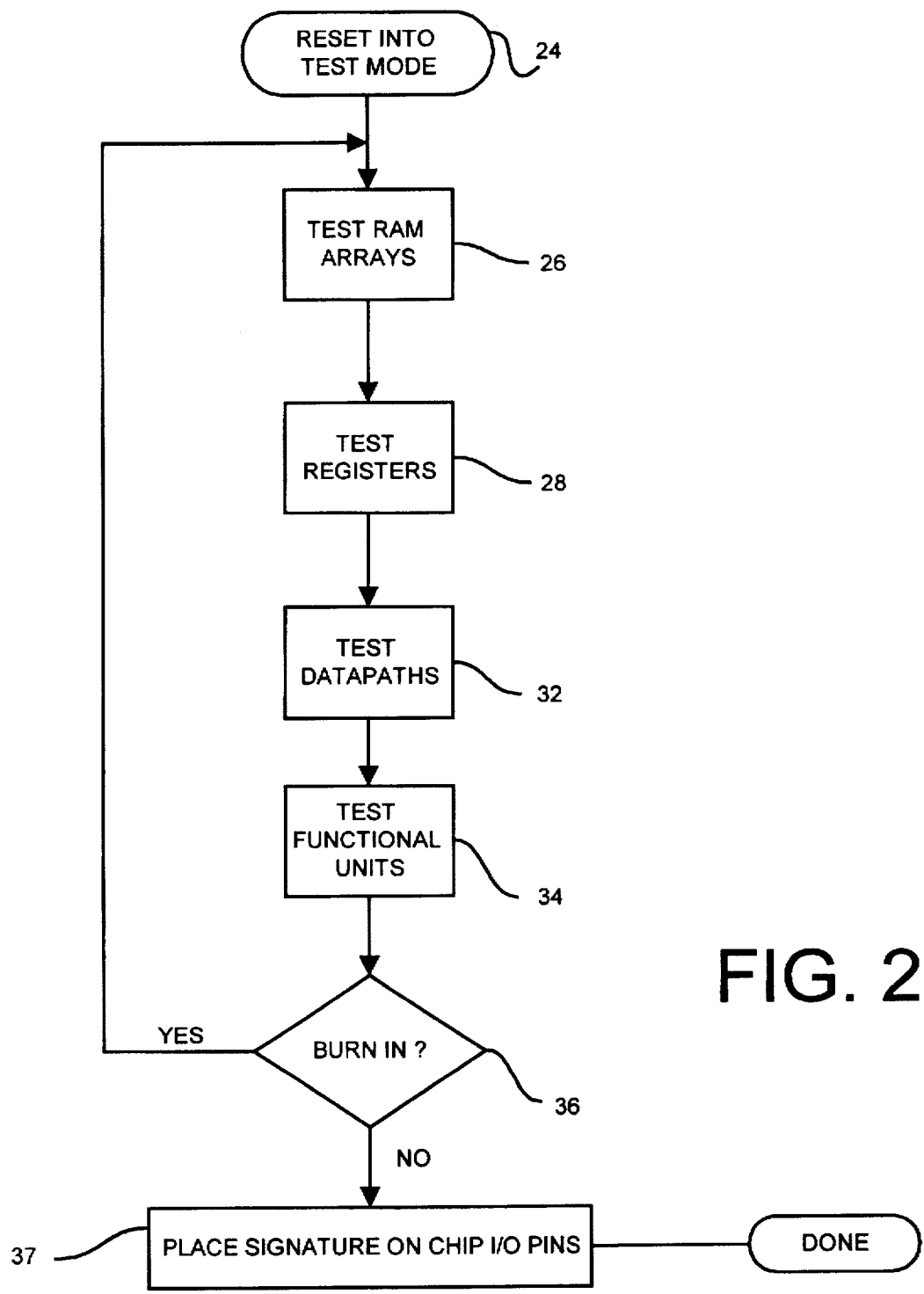
FIG. 2 is a flowchart of a test routine for testing a CPU core.

FIG. 2 is a flowchart of a test routine for testing a CPU core. The CPU core is initially reset into self-test mode, step 24. This could be a chip-wide reset, such as one asserted by an external reset pin on the die, or the reset could be a local reset which resets just the specific CPU core and not other CPU cores or other parts of the die. One or more pins may be asserted to cause the self-test mode to be entered on reset. Any RAM memory arrays in the CPU core are tested next, step 26. Special test modes can be used to allow these RAM arrays to be accessed from the I/O pins of the die without using the CPU core. In some embodiments the RAM arrays tested are in the shared portions of the die, such as the shared level-2 cache. Another approach which cuts test costs is to assume all RAM arrays are good and proceed directly to the functional test routine.

Registers in the CPU core, such as general-purpose registers (GPR's), architectural registers such as flags and control registers, and possibly pipeline staging registers are next tested, step 28. If all registers are connected together in a scan chain, then the scan chain can be used to test all the registers by scanning data through the chain. Datapaths are next tested, step 32. Datapaths include the various adders, incrementers, shifters, comparitors, multipliers, bypassing, forwarding, muxing paths of data in the pipelines of the CPU core. Functional units are then tested, step 34. For example, the arithmetic-logic-unit (ALU) in the execute stage is tested to determine if all logic and arithmetic functions can be performed.

When burn-in is being performed, the CPU core can be continuously tested by looping from step 36 and accumulating errors in the chip. Otherwise the test is completed and a signature generated from the functional test is placed on the chip's I/O pins and read by the external tester, step 37. The external tester compared the generated signature to an expected signature to determine if the functional test detected an error. The next CPU core can be tested following these same steps. The test routine of FIG. 2 is preferably programmed into ROM 30 of FIG. 1 so that external test vectors need not be applied to the die. Since the internal logic on the die can usually run at a higher clock rate than the external tester, using internally-generated test vectors allows a higher clock frequency to be used, cutting test time and cost. Test vectors stored in ROM can be previously generated using automatic-test-program generator (ATPG) programs.

SCAN CHAINS IN EACH CPU CORE—FIG. 3

Figure 3:
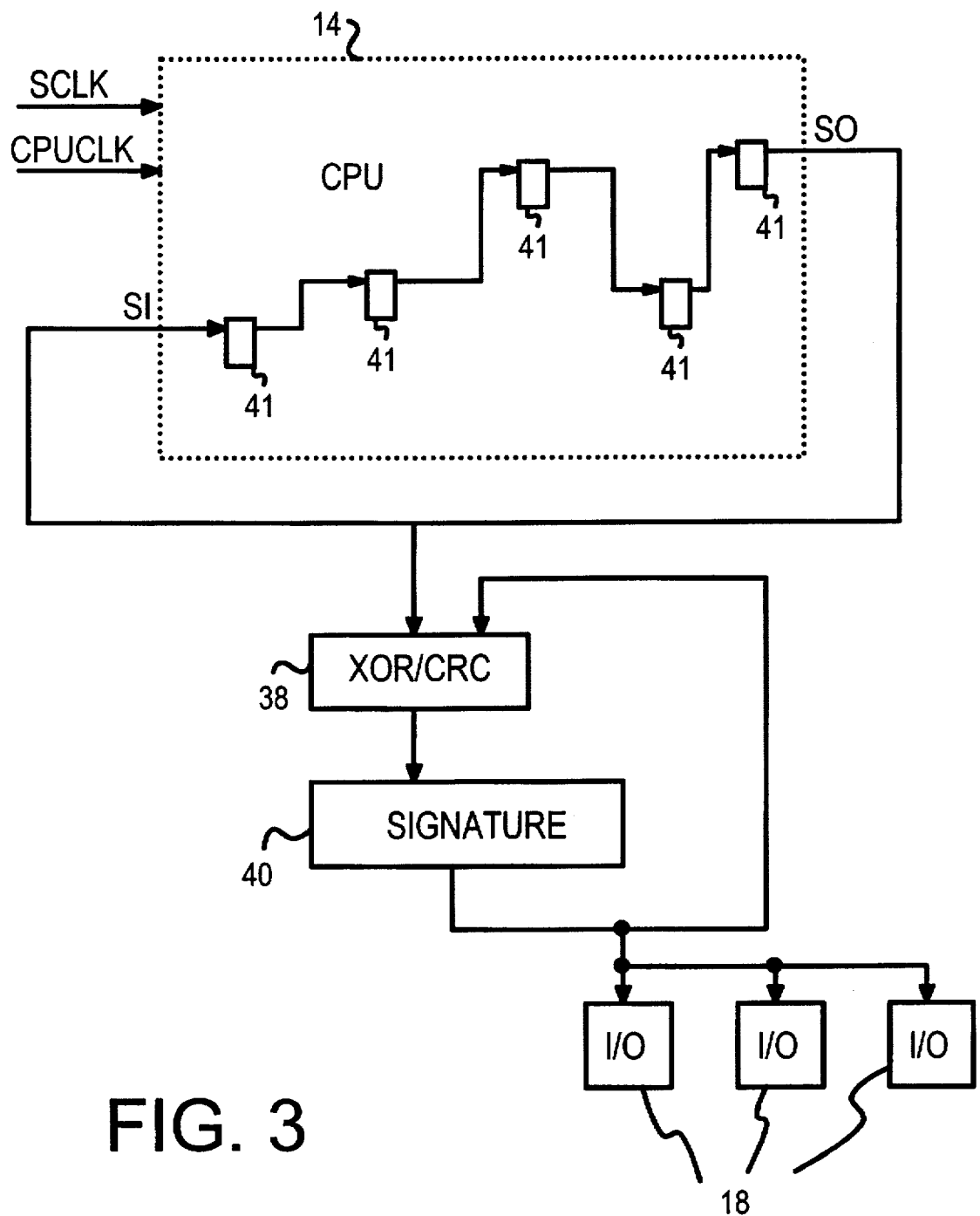
FIG. 3 is a diagram of scan-chain test logic in a CPU core.

FIG. 3 is a diagram of scan-chain test logic in a CPU core. CPU core 14 includes a large number of latches or flip-flops 41. Flip-flops 41 are connected together through combinatorial logic (not shown) to implement various functions performed by CPU core 14. When the normal CPU clock, CPUCLK, is pulsing, CPU 14 operates normally performing the processor's functions. However, during a scan test mode, CPUCLK does not pulse, but rather the scan clock, SCLK, is pulsed. Each pulse of the scan clock causes a bit of data in one flip-flop 41 to transfer to the next flip-flop 41 in the chain. The output of the last flip-flop 41 in the chain is output from CPU core 14 as shift-out SO, which is received by checker 38. Checker 38 exclusive-OR's SO bits received on successive scan clock pulses to generate a signature 40, typically using a linear-feedback shift register (LFSR).

Signature 40 may be read by the external tester by applying signature 40 on I/O pins 18. The external tester can confirm that the expected signature is read, or mark CPU core 14 as faulty if a different signature is read than expected.

Flip-flops 41 can be pre-loaded with specific values by shifting in the specific values into shift-in SI into the chain of flip-flops 41 in CPU core 14. Otherwise the shift-out SO can be looped back to the shift-in SI to re-load flip-flops 41 so the test can be continued from the same state. This is known as a non-destructive test.

A typical CPU core 14 may contain 8,500 flip-flops 41. If a single scan chain is used, then 8,500 pulses of scan clock SCLK are needed to scan out all the flip-flops. An alternative is to divide the 8,500 flip-flops 41 into several scan chains which are operated in parallel. For example, 32 scan chains can be used, with 32 shift-out SO bits received by checker 38 each scan clock pulse. This reduces the number of scan-clock pulses to scan the entire CPU core 14 from 8,500 clock pulses to about 270 pulses. CPU core 14 may be operated for some predetermined number of CPU clocks and then halted, and the scan chain clocked out by 270 scan clock pulses to generate a first signature. The first signature is then read by the external tester, and the CPU clock again run for a number of cycles. A second signature is then generated by scanning out the scan chain a second time. The second signature is read and confirmed by the external tester. This process of running the CPU clock and then scanning out the flip-flop's data can be repeated many times to confirm operation of CPU core 14.

Signature 40 is useful because of the large number of flip-flops 41 in CPU core 14. In one typical implementation each CPU core 14 contains 8,500 flip-flops 41 chained together. Since it is impractical to store an 8,500-bit signature, the 8,500 bits are reduced to a smaller signature of perhaps 32 bits. Parity or a CRC-scheme is commonly used. A problem with signatures is that aliasing can occur where a faulty CPU core can give the expected "good" signature. Larger signatures are less likely to have an alias generated.

The invention solves the aliasing problem by comparing each serial bit shifted out, during each scan-clock cycle, to the shift-out serial bits from other CPU cores.

TESTING MULTIPLE CPU'S

It is possible to simply test each CPU core on the die separately, reading out signatures from the scan chains of each CPU core and then comparing the signatures to an expected value. Current self-test logic for uni-processors typically compare the generated signature to an externally- or internally-stored expected value for the signature and signal an error when they differ.

When two or more substantially-identical CPU cores are present on the same die, one CPU core may be used to test the other CPU core. Two CPU cores can be used to check each other by running the same test routine on both and comparing results. The CPU cores may be tested in parallel by applying the same test routine to each core simultaneously. However, only one of the CPU's can drive the outputs of the die at any one time when a shared cache and shared BIU are used. Thus another way to observe the results from each CPU core is necessary when testing all CPU cores in parallel.

Signature 40 derived from each CPU's scan chain of flip-flops 41 can be used as the result from the CPU core. When the signatures from both CPU cores match for all test routines, it can safely be assumed that both cores are good. However, when the signatures from different CPU cores mismatch, it cannot readily be determined which CPU core is the faulty core. One possible solution is to read the signatures from each CPU core out to the external tester and compare to an expected signature to determine which CPU is faulty. Another solution is to present the serial output from each scan chain to the I/O pins for the external tester to check.

Voting With 3 or More CPU Cores to Determine Failures

When three or more CPU cores are present on the die, it is unlikely that any two of the CPU cores fail in the exact same manner as another CPU core. The results from the three CPU cores can be used to "vote" to determine which CPU core is faulty. For example, when two CPU cores generate a signature of "000AF", but the third CPU core running the same test routine generates a signature of "FF000", it is likely that the third CPU core is faulty but the other two are good.

While it is possible to compare the final signatures generated from the scan chains of each CPU core, accuracy is improved when each scan-chain bit shifted out of each CPU core is compared before the signatures are generated, as no aliasing can occur. Rather than wait for the signatures to be generated, during each scan clock cycle the shift-out SO from each CPU core is compared to the shift-outs from the other CPU cores. If the shift-out bits from all three CPU cores match, it is assumed that all cores are good. The next SO bits are shifted out of the scan chains and the comparison repeated. Errors are accumulated. Once the entire scan chain is shifted out the accumulated errors are read by the external tester. The CPU core with one or more errors accumulated for the scan chain is assumed to be faulty.

With three CPU cores, the signatures do not have to be read out to the external tester after each scan. Instead, just the accumulated errors are read. The accumulated errors in the simplest form are just three set-reset latches, one for each CPU core. An S-R latch is set on the first error by the corresponding CPU core. In most cases, simply by reading the three bits of the S-R latches the external tester can detect which CPU cores are defective. The external tester can simply monitor the output of the S-R latches to determine when an error occurs, or wait until the test ends and then read the S-R latches. The testing of the CPU cores does not have to be halted after each scan for the external tester to read the signatures.

Test Signatures Not Read Out To External Tester

Typically many test routines are executed on a CPU, with a signature generated after each routine. Thus many signatures are generated when testing a CPU. Reading each signature out consumes tester time and available I/O pins since the signatures can be many bits wide. Simply reading the accumulated error bits after all test routines are executed saves many tester cycles of reading signatures. Ideally no signature need be read out to the external tester except for diagnostic or pre-production uses to determine what the common failures are. For diagnostic purposes, it is useful to stop testing when a failure is detected and have the external tester read all observable compare inputs.

CPU SCAN-TEST VOTING CIRCUIT—FIG. 4

Figure 4:
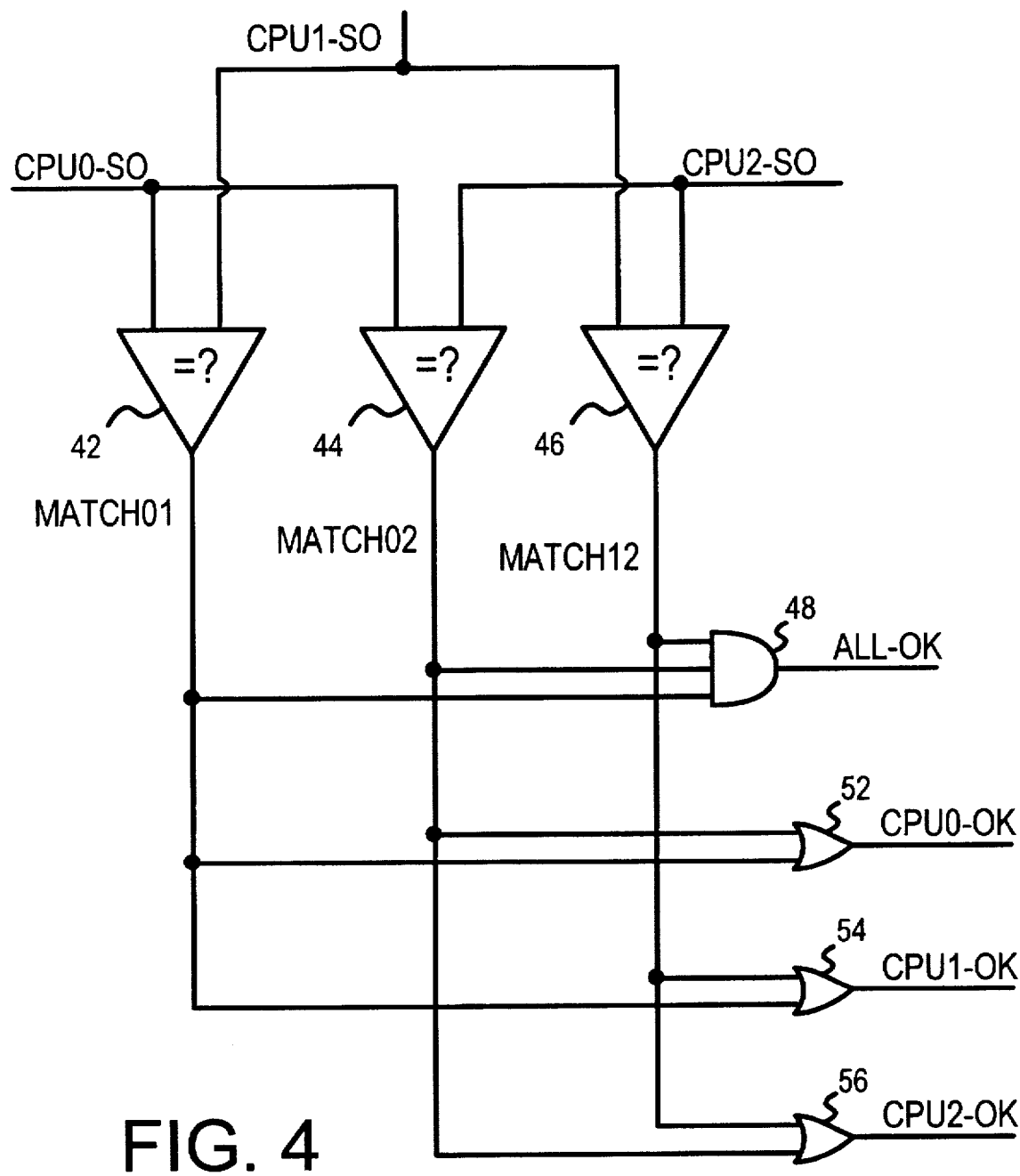
FIG. 4 is a voting circuit receiving scan-chain outputs from multiple CPU cores.

FIG. 4 is a voting circuit receiving scan-chain outputs from multiple CPU cores. Comparator 42 receives the shift out SO of the chain of flip-flops in CPU core 0. Comparator 42 also receives the shift out SO of the chain of flip-flops in CPU core 1. Comparator 42 signals MATCH01 when the shift-out SO from CPU core 0 matches the shift-out from CPU core 1. Likewise comparator 44 signals MATCH02 when the shift out from CPU core 0 matches the shift-out from CPU core 2, while comparator 46 signals MATCH12 when CPU core 1 and CPU core 2 have matching shift outputs.

When all three comparators detect matches, AND gate 48 signals ALL-OK, indicating that for the current scan clock cycle, all three CPU cores generated the same shift-out bit, and no error is thus detected. OR gate 52 signals CPU0-OK when a match is detected by either comparator 42 or comparator 44, which have the shift-out from CPU 0 as an input. OR gate 54 signals CPU1-OK when either of comparators 42, 46 detect a match with the shift-out from CPU core 1. OR gate 56 signals CPU2-OK when either of comparators 44, 46 detect a match with the shift-out from CPU core 2.

The signals CPU0-OK, CPU1-OK, and CPU2-OK each trigger an S-R latch (not shown) when low, setting the accumulated error bit for that CPU core. Thus rather than compare signatures, the scan-chain bits are compared before any signature is generated. The loss of information in generating the signature (aliasing) does not reduce the effectiveness of the test, since bits are compared before signature compression. Indeed, signatures need not be generated or read out in most cases.

COMPARE OF INTERNAL TEST POINTS—FIG. 5

Figure 5:
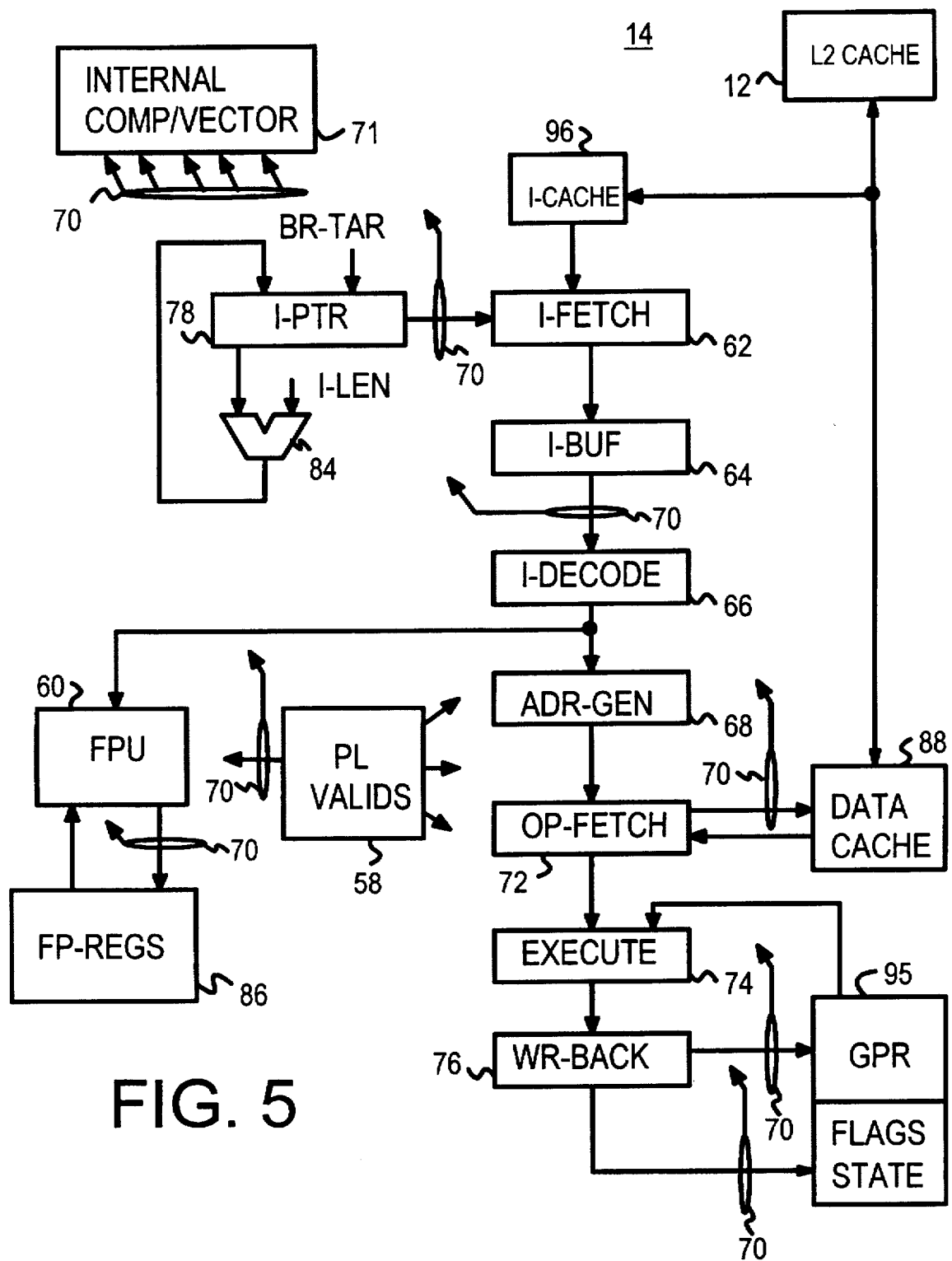
FIG. 5 is a diagram of a pipelined CPU core with internal test points and compression of test-point data.

FIG. 5 is a diagram of a pipelined CPU core with internal test points and compression of test-point data. A second-level shared cache 12 supplies instructions to local instruction cache 96 and data operands to local data cache 88. Second-level shared cache 12 is preferably a large cache which supplies instructions and data to all CPU cores. CPU core 14 processes instructions through a pipeline. The pipeline fetches instructions from local instruction cache 96 using instruction fetch stage 62, which operates to fetch instructions pointed to by instruction pointer 78. As instructions are fetched into instruction buffer 64 and decoded by decoder 66, adder 84 adds the length of the instructions fetched to the instruction pointer 78 to generate a new instruction pointer 78. When a branch is taken or predicted, the branch target address is loaded into instruction pointer 78 instead of the sequential address from adder 84. While instruction pointer 78 is shown as pointing to the next instruction to be fetched by instruction fetch stage 62, persons of skill in the art recognize that instruction pointer 78 may be modified to point to the instruction being decoded by instruction decoder 66 as is more traditionally done.

Decoder 66 determines the type(s) of operations required and passes a decoded instruction to address generate stage 68, which performs an address calculation when required by the decoded instruction. Operand fetch stage 72 fetches a data operand from local data cache 88, or writes a data result to local data cache 88, possibly through a queuing or buffering structure (not shown). Execute stage 74 receives the fetched operand and possibly a register operand from register file 95. Execute stage 74 performs an operation defined by the decoded instruction. Many kinds of operations may be executed, such as addition, Boolean operations, shifts, and complex multi-cycle operations such as integer multiplication and division. Execute stage 74 typically uses an arithmetic-logic-unit (ALU) which includes a large adder.

Write-back stage 76 receives the result calculated by execute stage 74, and writes this result to register file 95. Register file 95 includes general-purpose registers (GPR's) and flags or condition-code registers, as well as system registers defining the state of the processor core.

Floating point instructions are processed by floating point unit (FPU) 60, which receives a decoded floating point instruction from decoder 66. Often many clock cycles are required to perform the floating point operation, and FPU 60 may include additional decode circuitry for decoding the more complex floating point instructions. Data operands are read from and results are written back to floating point registers 86. A path (not shown) to data cache 88 from floating point registers 86 is used for loading and storing floating point operands.

Pipeline valid bits 58 is an array of valid bits which indicate stages in the pipeline having valid instructions being processed. Pipeline stalls cause some stages to not contain valid instructions and pipeline valid bits 58 conveniently identify these stages.

Internal test points 70 are locations of electrical busses and nodes which are frequently changing in logic values represented by voltages. While many logical portions of CPU core 14 are specialized, perhaps only being used by infrequently-processed instructions, internal test points 70 are located near logic which is almost always used by most instructions. These frequently-changing points are ideal test points to quickly detect failures, thus reducing test time and cost.

Since instruction pointer 78 is advanced for almost every instruction fetched, a test point 70 is located on the output of instruction pointer 78. The instruction fetched to decoder 66 also changes frequently, so another test point 70 is located on the bus supplying the instruction to decoder 66. Two test points are used because instruction pointer 78 is an address while decoder 66 receives the instruction stored at the address.

Two more test points observe the result from the pipeline. Test points 70 are located at the output of operand fetch stage 72, and at the write port from write-back stage 76 to register file 95. While data both read and written to local data cache 88 could be observed with test points 70, data read from local data cache 88 is likely to be error-free when all arrays are first tested before testing the pipeline datapaths in core 14. Thus local data cache 88 and second-level shared cache 12 are tested and determined to be functional before operand fetch stage 72 is tested. While data operands read from local data cache 88 are unlikely to be faulty, data written from operand fetch stage 72 to data cache 88 is more likely to contain an error, since operand fetch stage 72 and decoder 66 have not been tested earlier in the test sequence. Thus the store output from operand fetch stage 72 contains a test point 70. In some embodiments this store output is generated from write-back stage 76 or another stage rather than from operand fetch stage 72.

The write ports to register file 95 likewise is observed by a test point 70, while the read ports are not observed. Again, register file 95 is an array tested before the pipeline stages are tested, and thus the read ports are less likely to detect an error. Faulty data is first detected while it is being written to register file 95 by the test point on the write ports. This test point 70 observes both the data being written to general-purpose registers in register file 95 and signals which update individual flag bits in a condition-code register in register file 95.

Floating point registers 86 also have a test point 70 on the write port from FPU 60. The read ports from floating point registers 86 do not connect to a test point since errors are unlikely to be detected from the previously-tested floating point registers 86.

Pipeline valid bits 58 also are observed by a test point 70 on the output from these valid bits. These valid bits are critical to the control and operation of the pipeline, and thus many errors can be detected early by observing these pipeline valid bits. Faulty branches and interrupts are detected much more quickly using the internal compare points than when simply observing data writes to external memory, which can occur many cycles after the faulty branch is taken.

Instruction pointer 78 outputs a 32-bit address, and thus 32 bits of test points are required. The instruction itself may be many bytes in size, and thus 96 bits are required for test point 70 before decoder 66. The write port to local data cache 88 is 64 bits wide, while the write port to register file 95 is also 64 bits of data and another 12 or so bits for the flags and state update. Floating point registers 86 have a 128-bit write port, and about 45 bits are required to observe pipeline valid bits 58. Thus a total of 32+96 +64+64+12+ 128+45=441 bits of test points 70 are used.

Full-Speed Testing Using Internal Test Points

It is cumbersome to route 441 signal lines from each CPU core to a central compare point for self-checking each internal test point from each CPU core to the internal test points in the other CPU cores. Instead, the 441 test-point bits from a core are first compressed to a smaller 8-bit vector. Although error information is lost by this much compression, and some aliases can signal false matches, the test points can be compared each CPU clock cycle during the normal operating mode of the CPU core, as long as the CPU cores are operating the same test program in lock-step.

Compression can occur by simply generating one or two parity bits for each of the 7 internal test points. Test points that are physically close to another test point can generate two parity bits from the combined test point bits, or all the test points can be combined and then 8 parity bits generated. More complex compression schemes could also be used. Compressor 71 receives the data from the internal test points 70 and generates an 8-bit internal vector which is transmitted to a central comparator.

The internal test points provide a powerful self-test since the CPU cores can be operated at full speed. For comparison, the scan-chain test requires 270 scan clock cycles to scan out the serial test data before the CPU clock can be re-started. Thus the internal test points can be used to test the CPU core at full speed, perhaps 270 times faster than the serial scan test. The scan clock often has a lower frequency than the CPU clock, so testing the internal test points is even more efficient than scan-chain tests. Since the internal test points observe different nodes than do the scan chains, the two tests complement each other.

INTERNAL TEST POINT REDUCTION—FIGS. 6, 7

Figure 6:
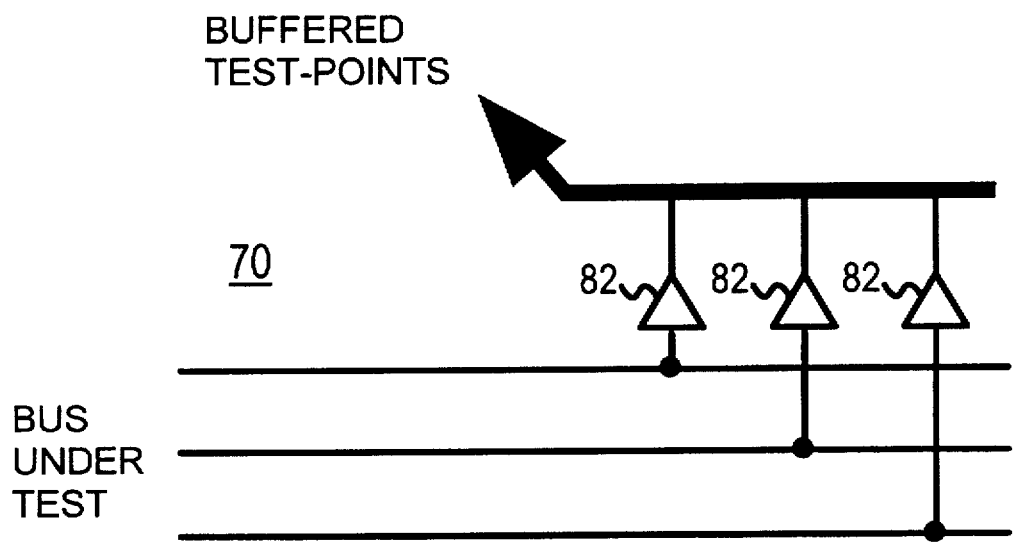
FIG. 6 illustrates an internal test point.

FIG. 6 illustrates an internal test point. A bus of signal lines which contain electrical voltages that indicate logic levels is tapped by buffers 82. Buffers 82 reduce the loading on the bus of signal lines to avoid increasing delays in the CPU core. Buffers 82 may also be replaced with a tree of exclusive-or gates to reduce the bus of signal lines to one or two parity bits. These cells can be powered-down when not running in test mode.

Figure 7:
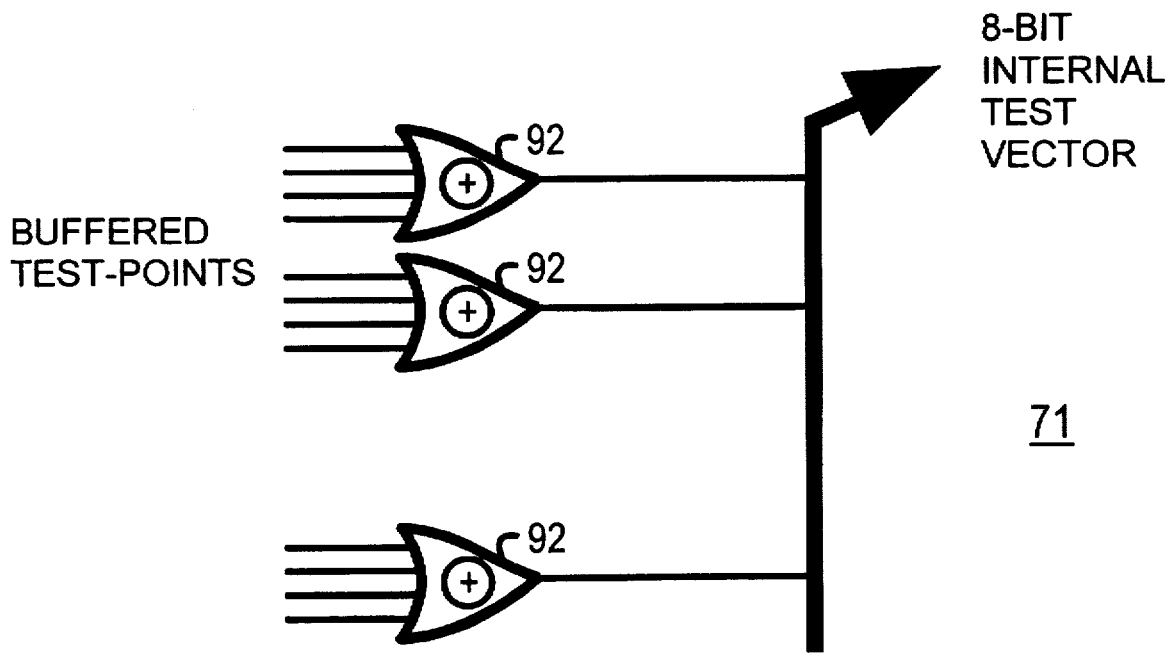
FIG. 7 illustrates compression of test data from the internal test points.

FIG. 7 illustrates compression of test data from the internal test points 70. Compressor 71 receives the buffered test point signals and generates parity bits by exclusive-ORing the test-point signals in gates 92. Buffers may also be used with gates 92 (not shown). A final 7- or 8-bit internal test vector is output from the 441 test point signals.

MULTI-CPU DIE WITH SHARED CACHE AND SELF-TEST—FIG. 8

Figure 8:
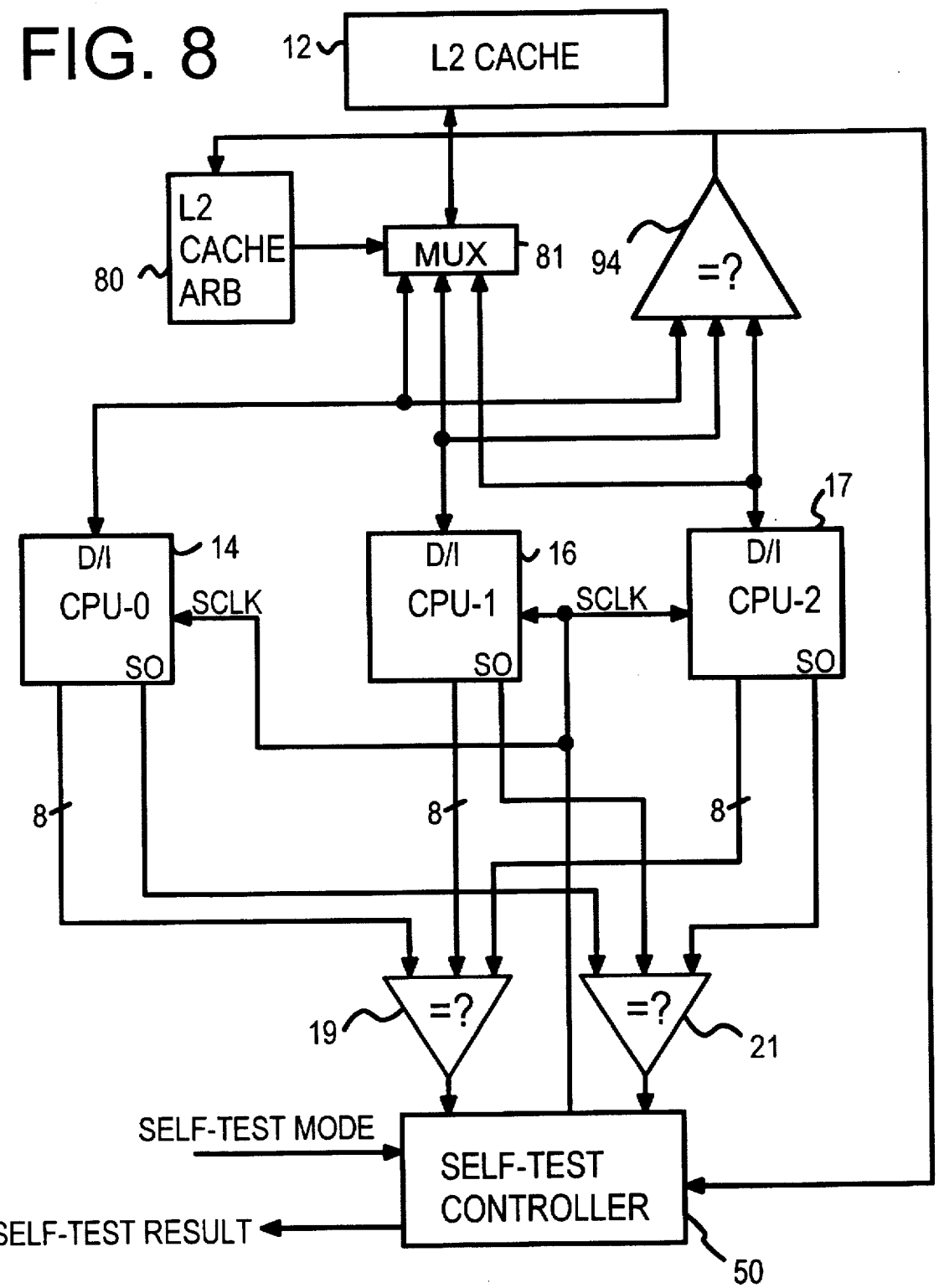
FIG. 8 is a self-testing multi-CPU die with a shared cache including serial scan and comparison of internal test points.

FIG. 8 is a self-testing multi-CPU die with a shared cache including serial scan and comparison of internal test points. CPU cores 14, 16, 17 each contain local caches and a pipeline for processing instructions fetched from second-level shared cache 12. Data results from CPU cores 14, 16, 17 are also written out to second-level shared cache 12. CPU cores 14, 16, 17 must arbitrate for read or write access to second-level shared cache 12 using arbitration unit 80. When access is arbitrated and granted to a particular CPU core, mux 81 coupled that CPU core to second-level shared cache 12. In normal operation only one CPU core, 14, 16, 17, is coupled to second-level shared cache 12 at any time. Arbitration unit 80 prioritizes requests from CPU cores 14, 16, 17 but does not allow any one CPU core to block out access of other CPU cores for an extended time period.

During test mode, arbitration unit 80 causes instructions from second-level shared cache 12 to be transmitted to all CPU cores simultaneously. Mux 81 drives an instruction being fetched to instruction busses to CPU cores 14, 16, 17 simultaneously during test mode. CPU cores 14, 16, 17 operate in lock-step by fetching the instruction at the same time, but they also simultaneously request to write their results to second-level shared cache 12. Arbitration unit 80 grants these request to all CPU cores simultaneously, which normally causes a bus conflict. However, mux 81 only connects one of the CPU cores to second-level shared cache 12 during test mode, and thus only one CPU core actually writes its result to second-level shared cache 12. The results from the other CPU cores are discarded after being compared by result comparator 94.

Result comparator 94 receives the results being written from each CPU core 14, 16, 17 to second-level shared cache 12. Result comparator 94 is similar to the serial scan-chain comparator shown in FIG. 4. Instead of receiving the serial scan shift-out bits from each CPU core, as in FIG. 4, result comparator 94 receives the parallel data busses from each CPU core, and thus requires that comparators 42, 44, 46 of FIG. 4 be extended to 64 bits for a 64-bit data path to second-level shared cache 12. All 64 bits of the data result from CPU cores 0 and 1 (14, 16) must match for a match to be signaled, or whatever portion of the 64 bits is being written for a partial write such as a byte-write. In addition, result comparator 94 receives the addresses from each CPU core, and control information, and these are compared as well.

When all results match, no error is detected for the current result being written. When a mis-match occurs, an accumulated error latch is set in self-test controller 50 for the mismatching CPU core. Each data result written out to second-level shared cache 12 can be checked by comparing the three results from the three CPU cores and using voting to determine which CPU core is defective.

Result comparator 94 also indicates to arbitration unit 80 which CPU core is mismatching. Arbitration unit 80 then selects the result from a matching CPU core rather than the result from the faulty, mis-matching CPU core. This ensures that a good result is written back to second-level shared cache 12. Writing a faulty result to second-level shared cache 12 could cause a false error later in the test sequence if the faulty result is later read by the CPU cores.

The internal compare points (as shown for FIG. 5) in each CPU core 14, 16, 17, are transmitted each CPU clock cycle to comparator 19. Comparator 19 operates in much the same way as result comparator 94 in detecting a mis-match and setting the accumulated error bit in self-test controller 50.

When a serial-scan mode is entered and the scan clock rather than the CPU clock is pulsing, then serial comparator 21 is used to check each serial bit shifted out of the shift-out SO output from each CPU core 14, 16, 17. Mis-matches are again used to set the accumulated error bits in self-test controller 50.

Thus FIG. 8 shows three different comparisons by comparators 19, 21, 94 for self-test. Result comparator 94 compares addresses and data written out to the shared cache. Scan comparator 21 compares the serial scan bits shifted out from each CPU core during a serial scan mode. Comparator 19 compares the parity of the internal compare points in each CPU core. All three comparators may be used at the same time, achieving a high amount of checking during self-check.

Figure 9:
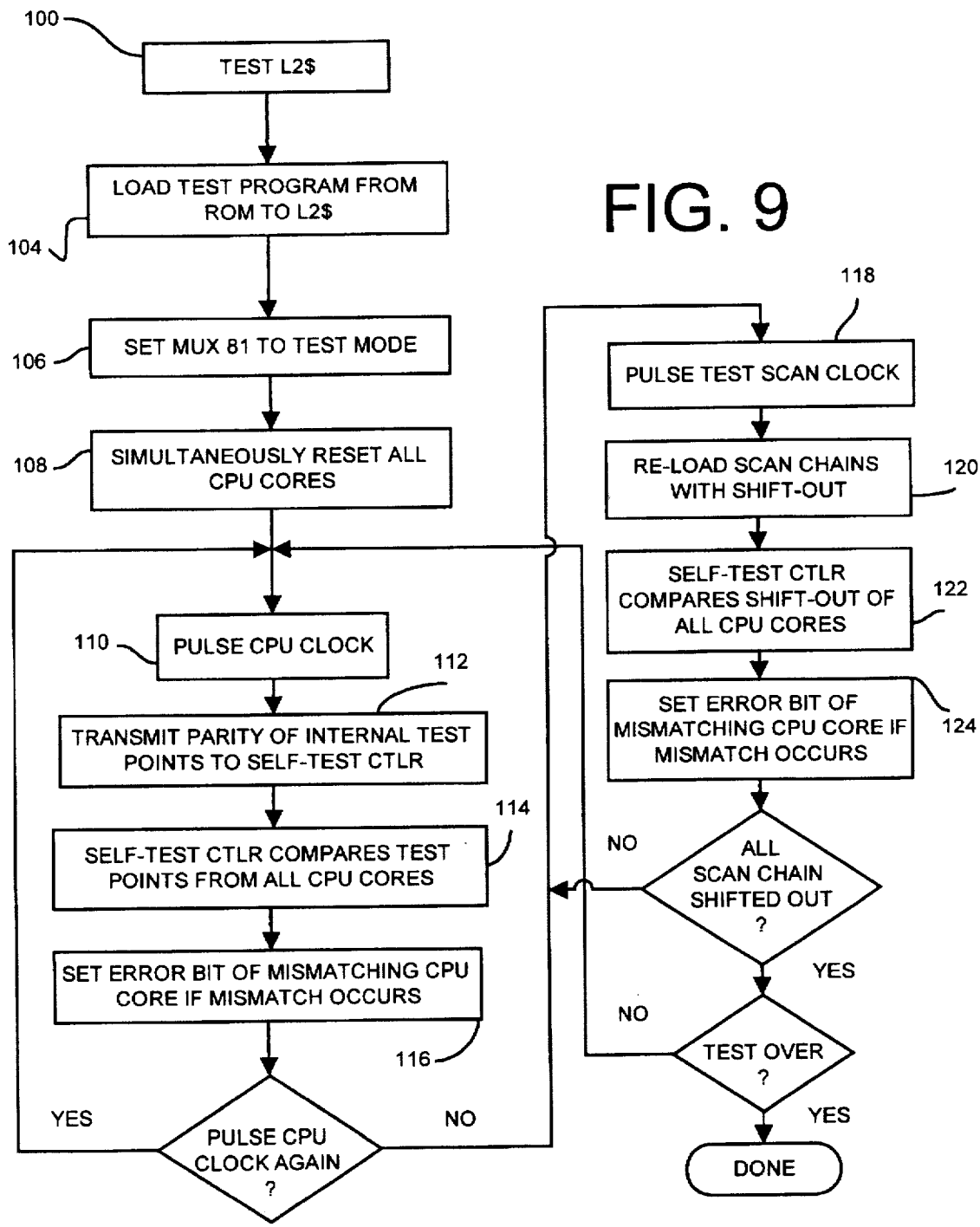
FIG. 9 is a flowchart of a test procedure for multi-processor die using self-test with serial scan and internal test points.

FIG. 9 is a flowchart of a test procedure for multi-processor die using self-test with serial scan and internal test points. The shared second-level cache is first tested, step 100. The test program is initially loaded into second-level shared cache 12 by the external tester, or preferably transferred or run from an on-chip ROM, step 104. Note that the 'test program' in second-level shared cache 12 is not the same test program being run on the external tester. The external tester loads all or part of the 'test program' as data onto the pins of the die when it finishes testing second-level shared cache 12.

The test program has a series of instructions to be processed by the CPU cores, and some initial data. The test program and the initial data are first loaded into second-level shared cache 12, once mux 81 is set to test mode so that instructions fetched are simultaneously sent to all CPU cores, step 106. Alternately, the external tester mimics external memory in supplying operands and instructions to shared cache 12. Then CPU cores 14, 16, 17 are simultaneously reset, step 108, so that they fetch the first instruction from a default address within second-level shared cache 12. The first instruction is simultaneously transferred to all three CPU cores and each core executes the first instruction and begins fetching subsequent instructions in the test program.

During each CPU clock cycle, step 110, when the test program is running, the compressed 8-bit vector of the internal test points is transmitted from CPU cores 14, 16, 17, to self-test controller 50, step 112. Each 8-bit vector is the parity from the 441 internal test points in each CPU core. Comparing these 8-bit vectors from each CPU core each CPU clock cycle (step 114) can quickly detect internal errors within a CPU core. A comparator and voting apparatus such as described for FIG. 4 is used for comparing the 8-bit vectors from the internal test points.

The test program being executed in the CPU cores can be halted at any point by stopping the CPU clock to CPU cores 14, 16, 17. The test clock, or serial scan clock, is pulsed once, step 118. The shift-out from each scan chain is connected to the shift input so that the chain is reloaded, step 120. The serial scan chains are shifted out and compared using the shift-out comparators of FIG. 4, step 122. Any mismatches set the accumulated error latch for the mismatching CPU core, step 124.

The scan clock SCLK is pulsed several hundred times to completely shift out all data from the serial chain of flip-flops. The data shifted out through the shift output SO can be looped back to the serial shift input so that the test program can be re-started after the serial scan test is completed. Alternately, new data can be shifted into the flip-flops by applying the new data to the serial shift input SI.

Anytime a mismatch occurs, either from result comparator 94, or from comparing the internal test points (step 116) or comparing the serial scan chains (step 124), an error is signaled by asserting the self-test result signal. The external tester can then halt testing and move on to the next die on the wafer. Halting the test immediately saves tester time and cost.

When the failure does not cause a cascade of future failures, the CPU core can 'recover' from the error. For example, a single bad data operand write can be recoverable, while a bad taken branch is not recoverable. When recoverable errors occur, a faulty CPU core can still be used to check other CPU cores. An alternative is to halt checking of the faulty core and continue comparing the remaining two cores. When two CPU cores each have different recoverable errors, then just one die can be indicated as good.

ECONOMICS OF MULTI-CPU DIE FOR SELF-TEST

The invention has the advantage that test time and test cost is reduced. When one CPU core checks the other CPU cores, the external tester is not actively checking I/O pins each internal cycle. Thus a much higher internal clock rate can be used. An internal clock multiplier can increase the rate of the external clock from the tester to generate the CPU and scan clocks. The higher internal clock rate reduces tester time and thus cost. Fewer external tester vectors are needed and thus less expensive testers with smaller test-vector memories can be used.

A complex, high-speed tester is no longer required. Most of the comparisons are performed within the die without the need for the external tester to read I/O pins and perform comparisons. Thus a relatively slow and inexpensive tester can be used, further reducing test costs. Older test machines are often available at low cost.

When only one CPU core on the die is functional, then self-test cannot completely test the die when non-recoverable errors occur. The signature must be read out to the external tester to determine if it is good. When two CPU's are functional on the die, then the CPU's can be used to check each other as previously described. Thus test cost is significantly less when two die are functional.

An approach is to use self-test for die with two or more functional CPU's. When testing determines that only one CPU is functional, then additional tester time is spent to read out and externally compare the signatures. Thus die with just one CPU functional are more expensive to test than dual-CPU die. A single-CPU die may cost $10 to test, while a die with 2 or more functional CPU cost just $1 to test.

Another approach is to discard die with only one functional CPU. As the hypothetical analysis below shows, only 6% of the die having three CPU cores present have just one of the CPU cores functional. Since these mono-CPU die are the least valuable, the cost to discard mono-CPU die is not large. Discarding the mono-CPU die reduces the test overhead as self-test can be used extensively.

Using standard yield equations described in Applicant's parent application, Table 1 compares the percent yield of die having one, two, three, and four CPU cores sharing a large level-two cache.

TABLE 1

| Die Yield for Multi-CPU Die | | | | |
|---|---|---|---|---|
| | 1-CPU Die | 2-CPU Die | 3-CPU Die | 4-CPU Die |
| 4 Good CPU's | — | — | — | 52% |
| 3 Good CPU's | — | — | 61% | 37% |
| 2 Good CPU's | — | 72% | 33% | 7% |
| 1 Good CPU's | 85% | 26% | 6% | 1% |
| No Good CPU's | 15% | 2% | 0% | 0% |

Table 1 assumes a yield for each CPU core of 85% while Table 2 assumes a yield for each CPU of 95%.

TABLE 2

| Die Yield for Multi-CPU Die | | | | |
|---|---|---|---|---|
| | 1-CPU Die | 2-CPU Die | 3-CPU Die | 4-CPU Die |
| 4 Good CPU's | — | — | — | 81% |
| 3 Good CPU's | — | — | 85% | 17% |
| 2 Good CPU's | — | 90% | 15% | 1% |
| 1 Good CPU's | 95% | 10% | 0% | 0% |
| No Good CPU's | 5% | 0% | 0% | 0% |

As Tables 1 and 2 show, multi-CPU die have acceptable yields when the basic processing yield is good. However, the Multi-CPU die have larger die sizes which reduces the number of available die on the wafer. Table 3 shows results of a calculation of the number of available die for wafers of 1, 2, 3, and 4 CPU cores and a large 512 K-Byte shared cache per die. A process having a 1.0 micron metal pitch is assumed. This process may have 0.2 micron gates. Each CPU is 25 $mm^2$ while the shared cache is 132 $mm^2$ in area.

TABLE 3

Available Die Per Wafer

| | Total area (mm²) | Available Die per 8" wafer |
|---|---|---|
| 4-CPU Die | 232 | 89 |
| 3-CPU Die | 207 | 114 |
| 2-CPU Die | 182 | 139 |
| 1-CPU Die | 157 | 164 |

When 85% of the CPU cores are functional, and 67% of the large shared caches are functional, then the number of good die of various types is shown in Table 4.

TABLE 4

Number of Good Die by Type of Die

| | # Good 1-CPU Die | # Good 2-CPU Die | # Good 3-CPU Die | # Good 4-CPU Die | Total # of Good Die |
|---|---|---|---|---|---|
| 4-CPU Die | 0 | 4 | 22 | 31 | 57 |
| 3-CPU Die | 5 | 25 | 47 | — | 77 |
| 2-CPU Die | 24 | 67 | — | — | 91 |
| 1-CPU Die | 93 | — | — | — | 93 |

ALTERNATE EMBODIMENTS

Several other embodiments are contemplated by the inventors. For example the invention has been described as having a CPU clock and a separate serial test clock.

Other embodiments may use a single clock with a test enable input to indicate when the clock is to shift data through the scan chain. Clocks can easily be divided or multiplied by those of skill in the art so that actions described herein occur every 2 or 4 clock pulses. The test program may be loaded from an external tester or generated from a built-in-self-test structure on the die.

When each CPU's test scan chain is divided into several separate chains, then comparators 42, 44, 46 of FIG. 4 can be parallel comparators, comparing each corresponding bit of each CPU core. Another option is to generate a CRC checksum or a parity bit from the parallel scan chains in each CPU core before the CRC or parity bit is transmitted to comparators 42, 44, 46.

Self-test is known by a variety of terms, including built-in-self-test (BIST), built-in test (BIT), autonomous test, and self-verification. Many variations of the basic pipeline herein disclosed are possible and the invention may be modified to benefit these embodiments as well. Self-test may provide incomplete coverage which is acceptable for wafer-sort, while a more exhaustive test is used for final test. For wafer-sort, coverage is thorough enough to avoid packaging bad die in most cases.

Power may be reduced by powering-down the self-test circuit during normal operation of the CPU's, and by powering-down faulty CPU's. Test modes and features can be accessed by setting bits in registers within the die, or bit asserting special test pins.

The shared cache memory may be either a primary, level-one cache, or a second-level or even third-level cache shared among the two processors. This shared cache may include a variety of other structures such as a bus-interface unit (BIU), snoop and invalidation logic, translation logic or arrays, and instruction or branch buffering or prediction logic along with an instruction prefetcher. A floating point unit (FPU) may also be shared among the two CPU cores.

The CPU core itself typically is a general-purpose processor core which can execute general-purpose instructions from an instruction set such as a RISC or a CISC instruction set, perhaps the PowerPC™ RISC or x86 CISC instruction sets. A great variety of programs may be executed by the CPU core. While the cores are substantially identical in function, some slight differences in features or functions is contemplated, and physical layout on the die may vary. Some CPU cores may have extended abilities, such as executing infrequently-encountered extended instructions, perhaps floating point instructions, in addition to the general-purpose instructions.

The CPU core is preferably a pipelined processor core including one or more execution pipelines. An execution pipeline may contain an instruction fetcher, decoder, an address generate unit and operand fetcher, an operation unit such as an arithmetic-logic-unit (ALU) and possibly a branch unit. For superscalar CPU cores, each execution pipeline may contain a subset of these units; for example a branch pipeline contains the branch unit while a load/store pipeline contains the address generate unit and operand fetcher.

The invention may be extended to four or more CPU cores sharing one or more cache memories. Other redundant units may be included, such as redundant MPEG encoders. For superscalar CPU cores, when the pipelines are symmetrical it is possible to disable one or more of the pipelines and operate the CPU core as a uniscalar CPU rather than a superscalar CPU.

The invention is also useful for burn-in, where the packaged die are placed on a board of sockets and power is applied in a high-temperature oven to stress the packaged die. The burn-in board is a very simple tester which pulses the clock and maybe only one or two other pins. For complex parts such as microprocessors, pulsing a few pins hardly exercises the internal cores of the chip. The self test mode of the invention requires so few inputs that it can be activated and continuously run for burn-in to more fully exercise the chip.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A self-testing microprocessor die comprising:

a first central processing unit (CPU) core, the first CPU core having a pipeline for processing a plurality of general-purpose instructions;

a second CPU core having a pipeline for processing the plurality of general-purpose instructions, the second CPU core substantially identical in function to the first CPU core;

a third CPU core having a pipeline for processing the plurality of general-purpose instructions, the third CPU core substantially identical in function to the first CPU core;

a shared cache, coupled to supply instructions and operands to the first CPU core, the second CPU core, and the third CPU core, the shared cache further coupled to I/O pins on the self-testing microprocessor die;

a self-test controller, receiving a first output from the first CPU core, a second output from the second CPU core, and a third output from the third CPU core, for comparing the first output, the second output, and the third output;

error signaling means, coupled to the self-test controller, for signaling a first error in the first CPU core when the first output does not match the second and third outputs, for signaling a second error in the second CPU core when the second output does not match the first and third outputs, and for signaling a third error in the third CPU core when the third output does not match the first and second outputs; and error output means, coupled to the error signaling means, for applying to the I/O pins of the self-testing microprocessor die signals indicating the first, second, and third errors;

wherein the first, second, and third outputs are not applied to the I/O pins of the self-testing microprocessor die, an external tester not receiving or comparing the first, second, and third outputs from each CPU core, the external tester merely reading the first, second, and third errors from the error signaling means, whereby outputs from different CPU cores are compared on-chip for signaling an error.

2. The self-testing microprocessor die of claim 1 wherein the first, second, and third outputs each comprise result data generated by processing of a general-purpose instruction in the pipeline, the result data being written to the shared cache, whereby results written back to the shared cache from different CPU cores are compared for self-test.

3. The self-testing microprocessor die of claim 2 further comprising:

a self-test ROM, coupled to the shared cache, for permanently storing a test program comprising a sequence of general-purpose instructions, the test program executing an extensive variety of operations performed by each CPU core for testing functionality of each CPU core, test activation means, coupled to an I/O pin on the self-testing microprocessor die, for activating a self-test mode and causing the test program from the self-test ROM to simultaneously begin executing on each of the CPU cores, wherein external test vectors containing the test program are not applied to the I/O pins of the self-testing microprocessor die, the external test vectors merely activating the self-test mode to execute the test program from the self-test ROM.

4. The self-testing microprocessor die of claim 3 further comprising:

an arbitration unit, receiving simultaneous requests from the first, second, and third CPU cores to write the result data to the shared cache, the arbitration unit sending a grant acknowledgment to all three CPU cores indicating that their result data is being written to the shared cache, but the arbitration unit discarding the result data from two of the cores and writing the result data from a selected CPU core to the shared cache, wherein the result data from the selected CPU core matches the result data from another CPU core, whereby faulty write data that mismatches is not written to the shared cache.

5. The self-testing microprocessor die of claim 1 wherein the first, second, and third outputs each comprise a shift-out output, each CPU core further comprising a serial scan chain of flip-flops within each CPU core, the serial scan chain for serially shifting data in the flip-flops out to the shift-out output;

whereby serial scan chains from different CPU cores are compared for self-test.

6. The self-testing microprocessor die of claim 5 further comprising: shift-clock means, coupled to the serial scan chain in each CPU core, for shifting bits of data in the serial scan chains out of the CPU core to the shift-out output, the bits of data in the serial scan chains being shifted by one bit for each pulse of a serial clock.

7. The self-testing microprocessor die of claim 1 wherein the first, second, and third outputs each comprise a plurality of internal test points within each CPU core, the internal test points being inaccessible from the I/O pins of the self-testing microprocessor die, whereby internal test points from different CPU cores are compared for self-test.

8. The self-testing microprocessor die of claim 7 wherein the internal test points are compressed before being transmitted to the self-test controller.

9. The self-testing microprocessor die of claim 8 wherein the internal test points are compressed by generating parity bits for the internal test points, the parity bits being transmitted to the self-test controller for comparison.

10. The self-testing microprocessor die of claim 9 wherein the parity bits from the internal test points are generated and transmitted to the self-test controller each cycle of a CPU clock, the CPU clock for advancing instructions to a next pipeline stage in the pipeline in each CPU core, whereby parity bits are generated from the internal test points and compared each CPU clock cycle.

11. The self-testing microprocessor die of claim 10 wherein the pipeline in each CPU core comprises an instruction pointer, a register file, and a plurality of pipeline stages including a decode stage for decoding general-purpose instructions, an address generate stage for generating an address of a data operand in the shared cache, an execute stage for performing an operation defined by a general-purpose instruction, and a write-back stage for writing a result to the register file, the internal test points comprising:

a first test point receiving an instruction address from the instruction pointer;

a second test point receiving an instruction ready for decoding by the decode stage;

a third test point receiving a data operand being written from the write-back stage to the register file;

whereby high-traffic test points deep within the pipeline are the internal test points compared by the self-test controller.

12. The self-testing microprocessor die of claim 11 wherein each CPU core further comprises a local cache, coupled to the shared cache, for storing instructions and operands for use by a local CPU core, the internal test points further comprising:

a fourth test point receiving a data operand being written to the local cache.

13. A method for testing a microprocessor die comprising the steps of:

connecting an external tester to external pins on the die;

asserting with the external tester an external test pin on the die to initiate a self-test mode by the die;

simultaneously resetting a plurality of substantially-identical processor cores on the die in response to the external test pin;

(a) pulsing a processor clock to the processor cores, the processor cores each generating an output which is not applied to external pins of the die;

(b) comparing the output generated from each processor core and signaling an error when at least one of the processor cores does not match the output from the other processor cores;

(c) setting an error bit for the processor core having the output that does not match the outputs from the other processor cores;

fetching additional instructions and repeating steps (a) to (c) until a test sequence is complete;

applying the error bits for each processor core to external pins on the die;

reading with the external tester the error bits for each processor core and marking the die as functional or non-functional in response to the error bits read;

whereby the die is self-tested by internally comparing outputs from multiple processor cores.

14. The method of claim 13 further comprising the step of:

testing a shared cache coupled to the processor cores;

loading instructions in the test sequence from a ROM on the die to the shared cache for fetching to the processor cores;

wherein the test sequence is stored in the ROM on the die and the test sequence is not supplied from the external tester.

15. The method of claim 14 wherein the output from each processor core comprises a result written to the shared cache.

16. The method of claim 15 wherein the output from each processor core further comprises parity bits generated from internal test points within each processor core, the internal test points not being accessible from the external pins of the die.

17. The method of claim 16 further comprising the steps of:

halting the pulsing of the processor clock;

(j) pulsing a test clock to flip-flops in each processor core connected together in a serial scan chain and shifting contents of the flip-flops down the serial scan chain;

(k) shifting out of a last flip-flop in the serial scan chain a shift output;

(l) comparing the shift output from each processor core;

(m) signaling an error when at least one of the processor cores does not match the shift output from the other processor cores;

(n) setting an error bit for the processor core having the shift output that does not match the shift outputs from the other processor cores;

repeating steps (j) through (n) until all the contents of the flip-flops in the serial scan chains have been shifted out through the shift output;

resuming the pulsing of the processor clock and continuing with step (a), whereby serial scan chains for each processor core are compared internally without an external comparison of the scan chains by the external tester.

18. The method of claim 17 wherein the external tester is a simple burn-in socket, the method further comprising the step of:

continuously repeating the test sequence at an elevated temperature and applying the error bits for each processor core to external pins on the die, whereby the test sequence is repeated continuously to exercise the die for burn-in.

19. A multi-processor die comprising:

a plurality of central processing unit (CPU) cores, each core having a pipeline for processing instructions and a scan test chain serially connecting storage nodes within the core;

a shared cache for supplying instructions and operands to the plurality of cores;

a self-test unit, receiving serial outputs from the scan test chains in each core, the self-test unit including:

compare means for comparing a serial output from a first core to the serial outputs from other cores;

voting means, coupled to the compare means, for determining a correct serial output, the correct serial output having a value matching a value of a serial output on another core;

error means, coupled to the voting means, for signaling an error when a serial output does not match the correct serial output;

wherein an external tester does not compare the serial output to an expected value but the voting means determined the correct serial output as a matching value, and wherein the shared cache occupies a larger area of the die than the area occupied by a processor core, each processor core further comprising a local cache, coupled to the shared cache, for storing instructions and operands for use by a local processor core.

* * * * *